United States Patent
Wang et al.

(10) Patent No.: US 10,330,963 B2
(45) Date of Patent: Jun. 25, 2019

(54) MACHINE TABLE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Haitao Wang, Beijing (CN); Wen Wang, Beijing (CN); Hongkang Jia, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 15 days.

(21) Appl. No.: 14/888,055

(22) PCT Filed: Mar. 23, 2015

(86) PCT No.: PCT/CN2015/074831
§ 371 (c)(1),
(2) Date: Oct. 29, 2015

(87) PCT Pub. No.: WO2016/070547
PCT Pub. Date: May 12, 2016

(65) Prior Publication Data
US 2016/0341983 A1    Nov. 24, 2016

(30) Foreign Application Priority Data
Nov. 7, 2014    (CN) .......................... 2014 1 0625878

(51) Int. Cl.
*G02F 1/13*    (2006.01)
*H01L 21/67*   (2006.01)
(Continued)

(52) U.S. Cl.
CPC ........ *G02F 1/1303* (2013.01); *H01L 21/6715* (2013.01); *H01L 21/67253* (2013.01);
(Continued)

(58) Field of Classification Search
CPC ............... G02F 1/1303; H01L 21/6715; H01L 21/67253; H01L 21/67288;
(Continued)

(56) References Cited

U.S. PATENT DOCUMENTS 3,490,102 A * 1/1970 Wheelock .............. A41G 5/004
                                                19/115 R
4,088,312 A * 5/1978 Frosch .................. B23Q 1/035
                                                 269/21

(Continued)

FOREIGN PATENT DOCUMENTS

CN    1404124 A    3/2003
CN    103472603 A  12/2013
(Continued)

OTHER PUBLICATIONS

Office Action in Chinese Patent Application No. 201410625878.4, dated Aug. 31, 2016.
(Continued)

*Primary Examiner* — Tyrone V Hall, Jr.
(74) *Attorney, Agent, or Firm* — Brooks Kushman P.C.

(57) ABSTRACT

The present disclosure provides a machine table for supporting a substrate. The machine table includes a body; pin holes each penetrating through the body in a thickness direction; and support pins each received in the pin hole and movable up and down in the thickness direction, each support pin including a built-in cavity from which an antistatic liquid is sprayed onto an upper surface of the body.

10 Claims, 3 Drawing Sheets

(51) Int. Cl.
*H01L 27/12* (2006.01)
*H01L 21/687* (2006.01)

(52) U.S. Cl.
CPC .. *H01L 21/67288* (2013.01); *H01L 21/68742* (2013.01); *H01L 21/68785* (2013.01); *G02F 2202/22* (2013.01); *H01L 27/1259* (2013.01)

(58) Field of Classification Search
CPC . H01L 21/68785; H01L 21/027; B25B 11/00; B25B 5/16
See application file for complete search history.

(56) References Cited

U.S. PATENT DOCUMENTS

| | | | | |
|---|---|---|---|---|
| 4,200,272 A * | 4/1980 | Godding | ............ | B23Q 1/035 269/26 |
| 4,684,113 A * | 8/1987 | Douglas | ............ | B23Q 1/035 269/21 |
| 5,411,617 A * | 5/1995 | La Fiandra | ...... | B29D 11/00596 156/154 |
| 5,457,868 A * | 10/1995 | Blaimschein | ......... | B23Q 1/035 269/21 |
| 5,474,102 A * | 12/1995 | Lopez | ............ | F16L 41/03 137/271 |
| 5,722,646 A * | 3/1998 | Soderberg | ............ | B25B 11/005 269/20 |
| 6,032,348 A * | 3/2000 | Haas | ............ | B25B 1/2421 269/266 |
| 6,158,727 A * | 12/2000 | Fox | ............ | H05K 13/0069 269/20 |
| 6,186,171 B1 | 2/2001 | Tanaka et al. | | |
| 6,592,049 B1 * | 7/2003 | Wolput | ............ | B05B 1/202 239/211 |
| 8,057,206 B1 * | 11/2011 | McKnight | ............ | B29C 33/0011 249/161 |
| 8,469,345 B2 * | 6/2013 | Samac | ............ | B23Q 3/06 269/21 |
| 8,712,568 B2 * | 4/2014 | Nakagawa | ............ | G06F 11/073 438/107 |
| 9,120,185 B2 * | 9/2015 | Kobayashi | ............ | B23K 37/04 |
| 2006/0177565 A1 | 8/2006 | Bhattacharya et al. | | |
| 2006/0267262 A1 * | 11/2006 | Schiavi | ............ | B25B 11/005 269/21 |
| 2010/0133903 A1 | 6/2010 | Rufer et al. | | |
| 2011/0089137 A1 * | 4/2011 | Tanaka | ............ | H01L 21/02057 216/13 |
| 2011/0163122 A1 * | 7/2011 | Ueda | ............ | B05B 9/04 239/17 |
| 2016/0268157 A1 * | 9/2016 | Gong | ............ | G02F 1/1303 |

FOREIGN PATENT DOCUMENTS

| | | | | |
|---|---|---|---|---|
| CN | 104409389 A * | 3/2015 | ....... | H01L 21/68742 |
| JP | H0458520 A | 2/1992 | | |
| JP | 2004127998 A * | 4/2004 | | |
| JP | 2006-216583 A | 8/2006 | | |
| JP | 2006216583 A * | 8/2006 | | |
| JP | 2009-168860 A | 7/2009 | | |
| TW | 282421 B | 8/1996 | | |

OTHER PUBLICATIONS

International Search Report and Written Opinion in PCT International Application No. PCT/CN2015/074831, dated Aug. 14, 2015.
Second Office Action for Chinese Application No. 201410625878.4, dated Apr. 19, 2017, 5 Pages.

* cited by examiner

MACHINE TABLE

CROSS-REFERENCE TO RELATED APPLICATION

This application is the U.S. national phase of PCT Application No. PCT/CN2015/074831 filed on Mar. 23, 2015, which claims a priority of the Chinese Patent Application No. 201410625878.4 filed on Nov. 7, 2014, the disclosures of which are incorporated in their entirety by reference herein.

TECHNICAL FIELD

The present disclosure relates to the production of semiconductor device or thin film transistor liquid crystal display (TFT-LCD), in particular to a machine table for eliminating electrostatic charges.

BACKGROUND

An array chemical vapor deposition (CVD) repair device, as a main maintenance device for an array segment in a thin film transistor liquid crystal display (TFT-LCD) panel, is a configured to inspect and rate bad lines and bad contacts of an array substrate, and to maintain the defective array substrate. As shown in FIG. 1, an existing machine table includes a body 2 for supporting a substrate 1, and a support pin 3. When the substrate 1 is moved onto the machine table, the support pin 3 moves upward to support the substrate 1 above the body 2. Then, the support pin moves downward until the substrate 1 is placed on the body 2. When the substrate 1 is moved away from the machine table, the support pin 3 moves upward to support the substrate 1 above the body 2, and then the substrate 1 is taken out of the machine table. In the above procedures, due to the blockage of the substrate 1 and the existence of a blind region, it is impossible for a deionizing wind from an ion stick to reach some regions above the body 2 and the substrate 1. At this time, there may exist the following risks.

1. When the substrate 1 is moved onto or out from the machine table, the substrate 1 is in contact with the body 2, resulting in friction between the substrate 1 and a surface of the body 2. At this time, an electrostatic balance at the surface of the body 2 is thrown off, electrostatic accumulation occurs topically, and charge accumulation is induced at a position where the signal lines overlap each other on the TFT array substrate. Hence, under the excitation of subsequent process conditions, unrepairable broken circuit or short circuit may occur.

2. When the support pin 3 moves downward to separate itself from the substrate 1, the separation is performed too fast. At this time, electrostatic breakthrough occurs at the position where the signal lines overlap each other on the substrate 1 due to a sudden change in the surroundings, and parts of the signal lines may be broken or short-circuited due to the electrostatic discharge (ESD).

3. Along with a decrease in a thickness of the substrate, once upon the electrostatic accumulation occurs at the surface of the body 2, it may adsorb the substrate 1, and when the substrate 1 is lifted up, it may be curved and deformed, resulting in undesired cracks and splits.

SUMMARY

An object of the present disclosure is to provide a machine table, so as to prevent the occurrence of broken circuit and short circuit for a substrate on the machine table due to electrostatic electricity and to prevent the substrate from being damaged.

In one aspect, the present disclosure provides in one embodiment a machine table for supporting a substrate, including: a body; pin holes each penetrating through the body in a thickness direction; and support pins each received in the pin hole and movable up and down in the thickness direction, each support pin including a built-in cavity from which an antistatic liquid is sprayed onto an upper surface of the body.

Alternatively, the machine table further includes a liquid supplying pipe in communication with the cavity of the support pin and a container, and a lower end of the liquid supplying pipe is immersed into the antistatic liquid contained in the container.

Alternatively, the support pin is of a hollow, cylindrical structure with a sealed top end.

Alternatively, a via-hole for spraying the antistatic liquid is provided in a side wall of the support pin.

Alternatively, a plurality of equal-sized via-holes is provided symmetrically relative to a center of the support pin.

Alternatively, a plurality of support pins is provided so as to spray the antistatic liquid onto the entire upper surface of the body.

Alternatively, the support pins are evenly arranged on the body in a matrix form.

Alternatively, a plurality of support pins is provided, the liquid supplying pipe includes a main pipe and a plurality of manifolds in communication with the main pipe, a main inlet of the main pipe is in communication with the container through an opening, and an outlet of each manifold is in communication with the cavity of the support pin.

Alternatively, the container includes a pneumatically-controlled liquid supplying unit for controlling the spraying of the antistatic liquid by the liquid supplying pipe.

Alternatively, the pneumatically-controlled liquid supplying unit includes a gas source, a gas supplying pipe in communication with the gas source, and a solenoid for controlling the gas discharge, and the gas supplying pipe is further in communication with the container.

Alternatively, the machine table further includes an electrostatic charge measuring unit and a control unit, the electrostatic charge measuring unit is configured to measure electrostatic parameters about the body and/or the substrate and transmit the electrostatic parameters to the control unit, and the control unit is configured to control on and off states of the solenoid as well as upward and downward movements of the support pin in accordance with the measured electrostatic parameters, thereby to control the spraying of the antistatic liquid.

Alternatively, the machine table further includes an alarm unit connected to the control unit and configured to send an alarm under the control of the control unit when the electrostatic parameter exceeds a threshold.

Alternatively, the upper surface of the body is provided with recesses in which the electrostatic charge measuring units are arranged.

Alternatively, the electrostatic parameter measured by the electrostatic charge measuring unit includes electrostatic dissipation time from a first preset voltage to a second preset voltage lower than the first preset voltage.

Alternatively, the electrostatic parameters are divided into several levels in accordance with the values of the electrostatic parameters, and the control unit is further configured to control turn-on time and/or an opening level for the solenoid.

According to the machine table in the embodiments of the present disclosure, the cavity is provided inside the support pin, and the antistatic liquid is sprayed through the cavity onto the upper surface of the body, so as to form a conductive film thereon, thereby to thoroughly eliminate the electrostatic charges.

In addition, the support pin is connected to the container containing the antistatic liquid, and the container is then connected to the pneumatically-controlled liquid supplying unit, so it is able to control the amount and the spraying duration of the antistatic liquid by controlling the solenoid, thereby to effectively eliminate the electrostatic charges generated due to, e.g., friction, and prevent the occurrence of electrostatic interference and dust.

Further, the electrostatic charge measuring unit is arranged in the body to measure the amount of the electrostatic charges at the surface of the body, and once this amount exceeds a predetermined range, an alarm may be sent. Also, a control unit is arranged in the body to automatically coat the antistatic liquid at a controllable amount and a controllable duration. As a result it is able to coat the antistatic liquid conveniently and evenly, thereby to reduce the time desired when the antistatic liquid is coated manually and prevent the occurrence of uneven coating.

BRIEF DESCRIPTION OF THE DRAWINGS

In order to illustrate the technical solutions of the present disclosure or the related art in a clearer manner, the drawings desired for the present disclosure or the related will be described hereinafter briefly. Obviously, the following drawings merely relate to parts of the embodiments of the present disclosure, and based on these drawings, a person skilled in the art may obtain the other drawings without any creative effort.

DETAILED DESCRIPTION

The present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art, without any creative effort, may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
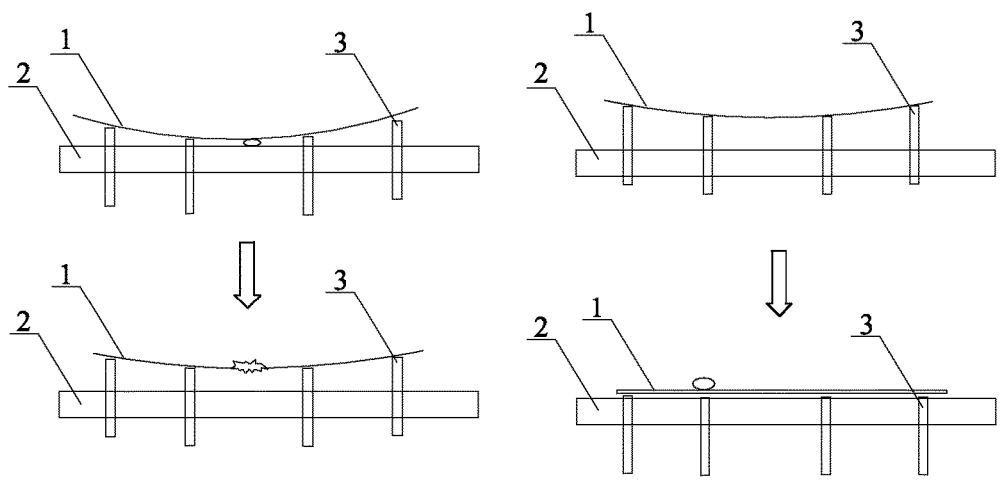
FIG. 1 is a schematic view showing an existing machine table when a substrate is moved onto and out from the machine table.
Figure 2:
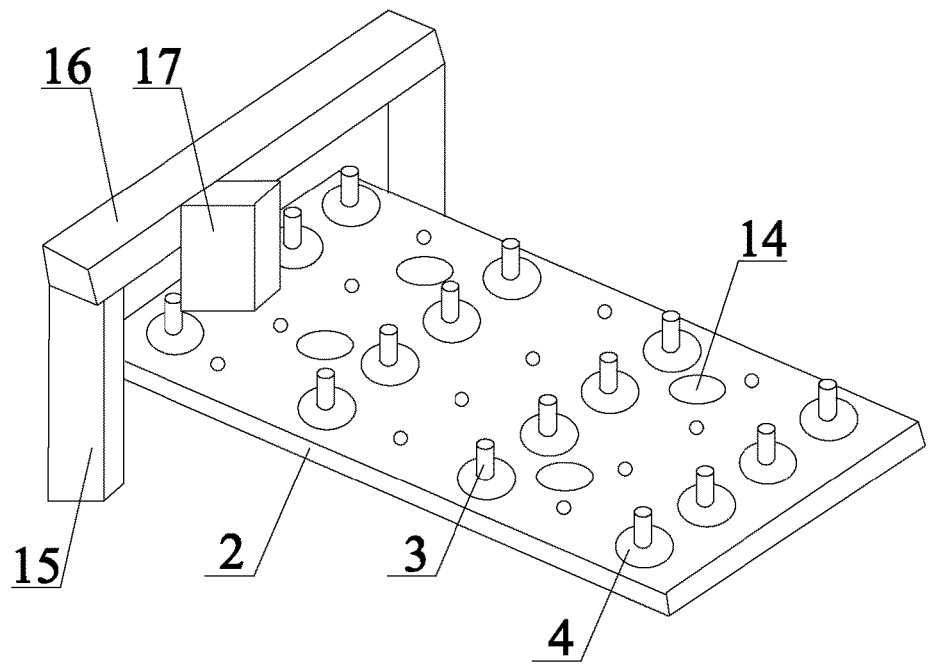
FIG. 2 is a solid view of a machine table according to one embodiment of the present disclosure.

As shown in FIG. 2, a machine table for supporting a substrate includes pin holes 4 arranged in a body 2 and penetrating the body 2 in a thickness direction, and support pins 3 each received in the pin hole 4 and movable up and down in the thickness direction of the body 2. Each support pin 3 is of a cylindrical structure within which a cavity is provided, and an antistatic liquid may be sprayed from the cavity in the support pin 3 onto an upper surface of the body 2. Further, the supporting pins 3 are arranged evenly on the body 2 in a matrix form so as to spray the antistatic liquid onto the entire upper surface of the body 2. The number of the support pins 3 may be set in accordance with the practical need.

The body 2 is further provided with recesses 14 in which an electrostatic charge measuring unit 11, such as a static electricity tester, is arranged, so as to measure electrostatic charges at an upper surface of the machine table at any time. There may be, but not limited to, four recesses 14, which are arranged at four regions of the body 2, respectively. The electrostatic charge measuring unit 11 is configured to measure electrostatic parameters about the body 2 and/or the substrate 1 in real time, and transmit these electrostatic parameters to a control unit 12. Through the data transmission and feedback, a change in the electrostatic parameters is analyzed for the body 2 in real time, so as to prevent the occurrence of the superfluous electrostatic charges on the body 2, thereby to prevent the substrate 1 from being adversely affected.

It should be appreciated that, the machine table may be any device capable of supporting the substrate. Apart from the above-mentioned members, the machine table may further include the other members to achieve the desired functions. For example, as shown in FIG. 2, the machine table further includes a laser unit 17 for cutting metallic residues from the conductive film on the substrate, motors 15 arranged at both sides of the body 2 in a widthwise direction to drive a bracket 16 to move, and the bracket 16 arranged above the motors 15 and configured to move in a lengthwise direction of the body 2 so as to inspect and rate (determine levels of) bad contacts.

Figure 3:
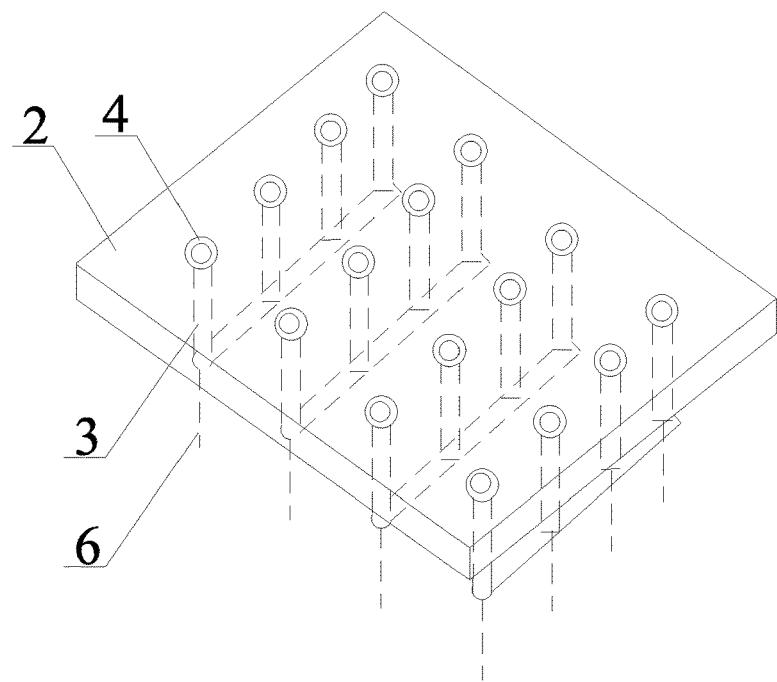
FIG. 3 is a top view of the machine table in FIG. 2.
Figure 4:
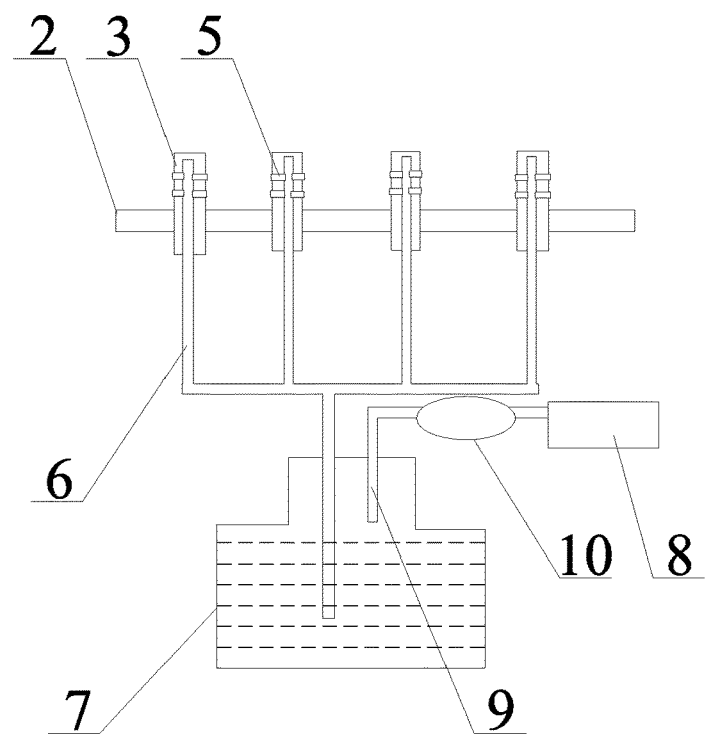
FIG. 4 is a side view of the machine table in FIG. 2.
Figure 5:
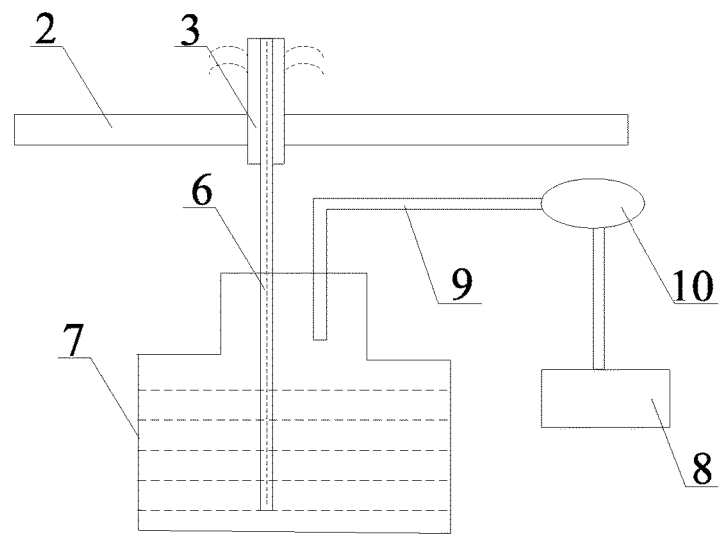
FIG. 5 is a schematic view showing an operating principle for the machine table in FIG. 2.
Figure 6:
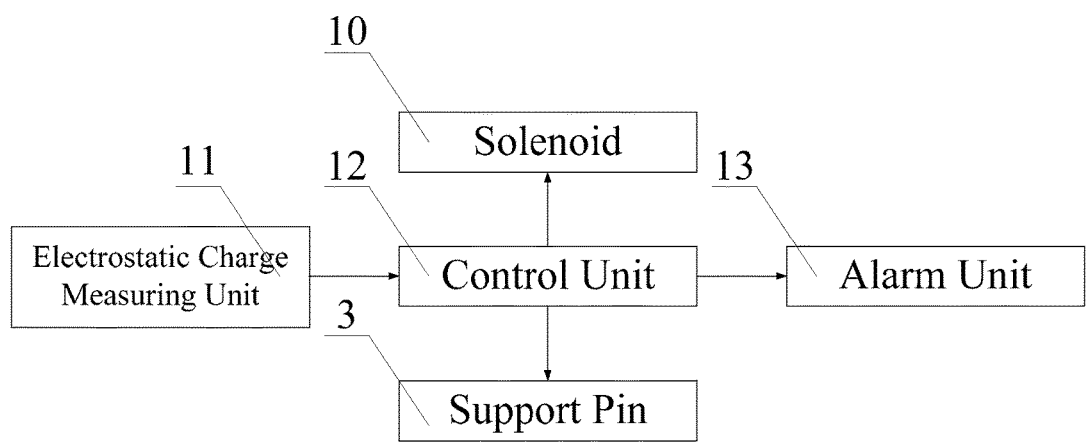
FIG. 6 is a block diagram of the machine table in FIG. 2.

As shown in FIGS. 3 and 4, the support pin 3 is of a hollow, cylindrical structure with a sealed top end, and four circular via-holes 5 are arranged at a wall of the support pin 3 for spraying the antistatic liquid. The via-holes 5 are of an equal size and distributed symmetrically with respect to a center of the support pin 3, so as to spray the antistatic liquid evenly and to control the amount thereof. Of course, the shape and the number of the via-holes 5 are not particularly defined in the embodiments of the present disclosure, and they may be set in accordance with the practical need. Through the via-holes 5, it is able to spray the antistatic liquid in a misty form, thereby to coat the antistatic liquid evenly and conveniently.

The cavity of each support pin 3 is connected to a corresponding liquid supplying pipe 6. To be specific, as shown in FIG. 4, there is a plurality of support pins 3. An upper surface of a container 7 is provided with openings for receiving the liquid supplying pipe 6 and a gas supplying pipe 9, respectively. The liquid supplying pipe 6 includes a main pipe and a plurality of manifolds in communication with the main pipe, a main inlet of the main pipe is immersed into the antistatic liquid in the container 7, and an outlet of each manifold is in communication with the cavity of the corresponding support pin 3. The main pipe is of a pipe diameter greater than the manifold, so as to introduce the antistatic liquid into each support pin 3 through the manifold.

A lower end of the main pipe is immersed into the antistatic liquid in the container 7 through the corresponding opening, so as to fully introduce the antistatic liquid into the cavity of the corresponding support pin 3, and prevent the leakage of the antistatic liquid. In the embodiments of the present disclosure, the liquid supplying pipe 6 is of a branch-type structure, i.e., a plurality of outlets corresponds to one main inlet. The outlet of each manifold of the liquid supplying pipe 6 is in hermetical communication with the cavity of the corresponding support pin 3, and the main inlet of the main pipe is immersed into the antistatic liquid in the container 7. The container 7 includes a pneumatically-controlled liquid supplying unit for controlling the spraying of the antistatic liquid by the liquid supplying pipe 6. The pneumatically-controlled liquid supplying unit includes a gas source 8, a gas supplying pipe 9 in communication with the gas source 8 at one end, and a solenoid 10 for controlling the gas discharge. The other end of the gas supplying pipe 9 is in hermetical communication with the container 7 through an opening.

FIGS. 2-6 show the working principle of the machine table.

After the machine table starts, the electrostatic charge measuring unit 11 begins to collect the electrostatic parameters. To be specific, when the substrate 1 is moved onto the surface of the body 2, the support pins 3 move up so as to support the substrate 1. Then, the support pins 3 move downward so as to place the substrate onto the body 2, the gas is blown toward the substrate 1, and then the substrate 1 is clamped by a clip (not shown) so as to be aligned and secured. Next, the blowing of the gas is stopped, the substrate 1 is released from the clip, and the frame moves so as to inspect and rate the bad contacts. After the rating and the maintenance, the support pins 3 moved upward so as to move the substrate 1 away from the machine table, and meanwhile the electrostatic parameters about the surface of the body 2 are collected by the electrostatic charge measuring unit 11 for the subsequent analysis and processing.

The electrostatic parameters in the embodiments of the present disclosure may be electrostatic dissipation time from a first preset voltage to a second preset voltage lower than the first preset voltage, e.g., the electrostatic dissipation time desired when the voltage rises to 1000V and then drops to 0V. When the substrate 1 is moved onto and away from the machine table, the electrostatic charge measuring unit 11 starts to measure the electrostatic parameters. A normal level is defined when the electrostatic dissipation time desired when the voltage rises to 1000V and then drops to 0V is less than 10 s, a grade-four alarm level is defined when the electrostatic dissipation time is within a range of 10 s to 20 s, a grade-three alarm level is defined when the electrostatic dissipation time is within a range of 20 s to 30 s, a grade-two alarm level is defined when the electrostatic dissipation time is within a range of 30 s to 60 s, and a grade-one alarm level is defined when the electrostatic dissipation time is greater than 60 s. The control unit 12 controls the ON and OFF states of the solenoid 10 as well as the upward and downward movements of the support pins 3 in accordance with the measured electrostatic dissipation time, thereby control the spraying of the antistatic liquid. Of course, the electrostatic parameter is not limited to the electrostatic dissipation time, and it may be set in accordance with the practical need. When the electrostatic parameter exceeds a threshold, the substrate 1 is moved away from the machine table and the support pins 3 are moved upward. Depending on the alarm level, the control unit 12 controls turn-on time and/or an opening level for the solenoid, so as to, by controlling a size and a duration of a gas stream, introduce the antistatic liquid in the container 7 into the via-hole 5 in the wall of the support pin 3 through the liquid supplying pipe 6, and then spray the antistatic liquid onto the surface of the body 2, thereby to control the amount and the spraying duration of the antistatic liquid. When the antistatic liquid has been sprayed onto the surface of the body 2, a thin, transparent conductive film is formed so as to effectively eliminate the electrostatic charges generated due to, e.g., friction, and prevent the occurrence of electrostatic interference and dust. The antistatic liquid consists of polar radicals and non-polar radicals, so it is soluble in water and alcohols. In addition, the antistatic liquid is non-toxic, non-combustible and pollution-free, so it is safe in use.

Further, the control unit 12 is also connected to an alarm unit 13. When the electrostatic parameter exceeds a predetermined threshold corresponding to a certain alarm level, the control unit 12 controls the alarm unit 13 to send alarm information, e.g., by flickering or beeping. At this time, the antistatic liquid is sprayed so as to eliminate the electrostatic charges. After the electrostatic charge measuring unit 11 detects the normal electrostatic parameter, the substrate 1 is moved onto the machine table, and the frame is moved to inspect, rate and maintain the bad contacts. The electrostatic charge measuring unit 11 continues to monitor the electrostatic state on the surface of the body 2, so as to systematically control the spraying of the antistatic liquid. To be specific, the antistatic liquid may be automatically sprayed at a controlled amount and a controlled spraying duration. As a result, it is able to reduce the time desired when the antistatic liquid is coated manually, prevent the occurrence of uneven coating, and improve the yield.

It should be appreciated that, the control unit in the embodiments of the present disclosure may include hardware and software. The hardware includes, but not limited to, a central processing unit (CPU), a programmable logic controller (PLC), a single chip microcomputer (SCM), a memory, a switch and a logic circuit. The control unit may be a single-piece unit or may include separate units, and it may be in communication with the other elements. The machine table in the embodiments of the present disclosure may further include an electric motor controlled by the control unit, so as to move, e.g., the support pins 3.

The above are merely the preferred embodiments of the present disclosure. It should be appreciated that, a person skilled in the art may make further modifications and improvements without departing from the spirit of the present disclosure, and these modifications and improvements shall also fall within the scope of the present disclosure.

What is claimed is:

1. A machine table for supporting a substrate, comprising:
   a body;
   pin holes each penetrating through the body in a thickness direction; and
   support pins each received in the pin hole and movable up and down in the thickness direction, each support pin including a built-in cavity from which an antistatic liquid is sprayed onto an upper surface of the body, the support pins being of a hollow, cylindrical structure with a sealed top end; and
   an electrostatic charge measuring unit and a control unit, wherein the electrostatic charge measuring unit is configured to measure electrostatic parameters about the body and/or the substrate and transmit the electrostatic parameters to the control unit, and the control unit is configured to control ON and OFF states of a solenoid as well as upward and downward movements of the support pin in accordance with the measured electrostatic parameters, thereby to control the spraying of the antistatic liquid, wherein the electrostatic parameter measured by the electrostatic charge measuring unit includes electrostatic dissipation time from a first preset voltage to a second preset voltage lower than the first preset voltage, wherein the electrostatic parameters is divided into several levels in accordance with values of the electrostatic parameters, and the control unit is further configured to control turn-on time and/or an opening level for the solenoid in accordance with the levels of the electrostatic parameters;

wherein the machine table further comprises a liquid supplying pipe in communication with the cavity of the support pin and a container, a lower end of the liquid supplying pipe is immersed into the antistatic liquid contained in the container, the liquid supplying pipe is of a branch-type structure and includes a main pipe and a plurality of manifolds in communication with the main pipe, and the main pipe is of a pipe diameter greater than the manifold.

2. The machine table according to claim 1, wherein a via-hole for spraying the antistatic liquid is provided in a side wall of the support pin.

3. The machine table according to claim 1, wherein a plurality of equal-sized via-holes is provided symmetrically relative to a center of the support pin.

4. The machine table according to claim 1, wherein a plurality of support pins is provided so as to spray the antistatic liquid onto the entire upper surface of the body.

5. The machine table according to claim 4, wherein the support pins are evenly arranged on the body in a matrix form.

6. The machine table according to claim 1, wherein a plurality of support pins is provided, the liquid supplying pipe comprises a main pipe and a plurality of manifolds in communication with the main pipe, a main inlet of the main pipe is in communication with the container through an opening, and an outlet of each manifold is in communication with the cavity of the support pin.

7. The machine table according to claim 1, wherein the container comprises a pneumatically-controlled liquid supplying unit for controlling the spraying of the antistatic liquid by the liquid supplying pipe.

8. The machine table according to claim 7, wherein the pneumatically-controlled liquid supplying unit comprises a gas source, a gas supplying pipe in communication with the gas source, and the solenoid for controlling the gas discharge, and the gas supplying pipe is further in communication with the container.

9. The machine table according to claim 1, further comprising an alarm unit connected to the control unit and configured to send an alarm under the control of the control unit when the electrostatic parameter exceeds a threshold.

10. The machine table according to claim 1, wherein the upper surface of the body is provided with recesses in which the electrostatic charge measuring units are arranged.

* * * * *